US012740181B2

(12) United States Patent
Xiao

(10) Patent No.: US 12,740,181 B2
(45) Date of Patent: Sep. 15, 2026

(54) PHOTOVOLTAIC ANTIGLARE PANEL ASSEMBLY, PHOTOVOLTAIC POWER GENERATION SYSTEM, AND PHOTOVOLTAIC SUBGRADE SYSTEM

(71) Applicant: NORTHWEST INSTITUTE OF ECO-ENVIRONMENT AND RESOURCES, CHINESE ACADEMY OF SCIENCES, Lanzhou (CN)

(72) Inventor: Jianhua Xiao, Lanzhou (CN)

(73) Assignee: NORTHWEST INSTITUTE OF ECO-ENVIRONMENT AND RESOURCES, CHINESE ACADEMY OF SCIENCES, Lanzhou (CN)

( * ) Notice: Subject to any disclaimer, the term of this patent is extended or adjusted under 35 U.S.C. 154(b) by 0 days.

(21) Appl. No.: 19/486,385

(22) PCT Filed: Dec. 6, 2023

(86) PCT No.: PCT/CN2023/136714
§ 371 (c)(1), (2) Date: Nov. 21, 2025

(87) PCT Pub. No.: WO2024/120428
PCT Pub. Date: Jun. 13, 2024

(65) Prior Publication Data

US 2026/0114078 A1 Apr. 23, 2026

(30) Foreign Application Priority Data

Dec. 9, 2022 (CN) ......................... 202211585737.5

(51) Int. Cl.
*H10F 77/42* (2025.01)
*H02S 30/10* (2014.01)
(Continued)

(52) U.S. Cl.
CPC ............. *H10F 77/42* (2025.01); *H02S 30/10* (2014.12); *H02S 40/34* (2014.12); *H10F 19/807* (2025.01)

(58) Field of Classification Search
None
See application file for complete search history.

(56) References Cited

U.S. PATENT DOCUMENTS

2003/0070706 A1* 4/2003 Fujioka ................... H10F 19/80 136/251
2012/0118359 A1* 5/2012 Battistutti ............... E06B 9/264 136/251

FOREIGN PATENT DOCUMENTS

CN 107587436 A 1/2018
CN 207852706 U 9/2018
(Continued)

OTHER PUBLICATIONS

International Search Report of PCTCN2023136714, China National Intellectual Property Administration, mailed on Mar. 6, 2024, with English translation.
(Continued)

*Primary Examiner* — Eli S Mekhlin
(74) *Attorney, Agent, or Firm* — Bayramoglu Law Offices LLC

(57) ABSTRACT

A photovoltaic antiglare panel assembly, a photovoltaic power generation system, and a photovoltaic subgrade system are provided. The photovoltaic antiglare panel assembly includes: a photovoltaic antiglare panel, the photovoltaic antiglare panel including double-layer tempered glass and a plurality of solar cells arranged between the double-layer tempered glass; a frame, the frame being sleeved on the periphery of the photovoltaic antiglare panel; a fixing unit, arranged at the bottom of the frame; and a power utilization unit, the power utilization unit being arranged in the fixing
(Continued)

unit, and the power utilization unit being in electrical connection with the plurality of solar cells.

11 Claims, 7 Drawing Sheets

(51) Int. Cl.
*H02S 40/34* (2014.01)
*H10F 19/80* (2025.01)

(56) References Cited

FOREIGN PATENT DOCUMENTS

| | | |
|---|---|---|
| JP | 2002180423 A | 6/2002 |
| JP | 2009062791 A | 3/2009 |

OTHER PUBLICATIONS

Written Opinion of The International Searching Authority of PCTCN2023136714, China National Intellectual Property Administration, mailed on Mar. 6, 2024, with English translation.
OA1 of priority document of CN202211585737.5, China National Intellectual Property Administration, issued on Mar. 27, 2025, with English translation.
OA2 of priority document of CN202211585737.5, China National Intellectual Property Administration, issued on May 19, 2025, with English translation.
Notification to Grant Patent Right for Invention of priority document CN202211585737.5, China National Intellectual Property Administration, issued on Aug. 1, 2025, with English translation.

* cited by examiner

PHOTOVOLTAIC ANTIGLARE PANEL ASSEMBLY, PHOTOVOLTAIC POWER GENERATION SYSTEM, AND PHOTOVOLTAIC SUBGRADE SYSTEM

CROSS REFERENCE TO THE RELATED APPLICATIONS

This application is the national phase entry of International Application No. PCT/CN2023/136714, filed on Dec. 6, 2023, which is based upon and claims priority to Chinese Patent Application No. 202211585737.5, filed on Dec. 9, 2022, the entire contents of which are incorporated herein by reference.

TECHNICAL FIELD

The present disclosure relates to the field of photovoltaic assembly and highway infrastructure technology, and in particular to a photovoltaic antiglare panel assembly, a photovoltaic power generation system and a photovoltaic subgrade system.

BACKGROUND

Photovoltaic power generation, as the fastest-growing and most technologically mature renewable energy source among clean energy sources, has gained worldwide recognition and plays an important role in addressing climate change and energy transition. In recent years, with the rapid development of photovoltaic power plants, available land resources have been decreasing, and the application of photovoltaic power generation in the transportation sector also has been gradually increasing. The northwest region of our country, especially and areas such as deserts and Gobi, is the region with the richest solar energy resources and the greatest potential for photovoltaic development. At the same time, these sparsely populated regions with vast territories are important areas for transportation infrastructure of our country. These regions have important conditions for the integrated development of photovoltaic power generation and transportation, which can support the early achievement of the carbon peaking and carbon neutrality goals of the transportation industry, provide green electricity for future electric vehicles, and supply power for charging piles. As one of the main "carbon sources", the development of photovoltaic applications in the transportation sector is of great significance.

SUMMARY

The present disclosure provides a photovoltaic antiglare panel assembly, a photovoltaic power generation system, and a photovoltaic subgrade system, to address the shortcomings of prior art antiglare panels, which are mainly made of materials such as metal and plastic and have limited functionality, failing to integrate with photovoltaic power generation, and to reduce glare from lamplight of vehicles in an opposite direction while fully utilizing solar energy for photovoltaic power generation, providing green electricity, and facilitating carbon neutrality of transportation systems. Moreover, the aforementioned photovoltaic antiglare panel assembly is a combined (modular) structure, is convenient to mount, replace, and maintain, and thus is suitable to implement and popularize.

The present disclosure provides a photovoltaic antiglare panel assembly, including:

- a photovoltaic antiglare panel, where the photovoltaic antiglare panel includes double-layer tempered glass and a plurality of solar cells sandwiched in the double-layer tempered glass;
- a frame, where the frame is sleeved on a periphery of the photovoltaic antiglare panel;
- a fixing unit, where the fixing unit is provided at a bottom of the frame; and
- a power utilization unit, where the power utilization unit is provided in the fixing unit, and the power utilization unit is in electrical connection with the plurality of solar cells, respectively.

For the photovoltaic antiglare panel assembly according to the present disclosure, in two mutually perpendicular directions, the plurality of solar cells are arranged at intervals from each other, and two adjacent solar cells have a preset distance therebetween.

For the photovoltaic antiglare panel assembly according to the present disclosure, the power utilization unit includes a junction box and a power transmission line; and the fixing unit includes:

- a base, where the base is provided at the bottom of the frame, and the junction box is arranged in the bottom;
- a support portion, where the support portion is provided at a bottom of the base, the support portion is in an elongated shape and configured to be provided along a highway, and the power transmission line is provided in an inner cavity of the support portion; and
- a column, where the column is provided at a bottom of the support portion, and is configured to be fixed to ground.

For the photovoltaic antiglare panel assembly according to the present disclosure, a height on two sides of the base is lower than a height in a middle of the base, and the middle of the base is connected to the frame.

For the photovoltaic antiglare panel assembly according to the present disclosure, a sealing sheet is provided in the base, and the sealing sheet is sealedly provided on an outside of the junction box.

For the photovoltaic antiglare panel assembly according to the present disclosure, two sides of each solar cell have power generation areas.

For the photovoltaic antiglare panel assembly according to the present disclosure, a material of the double-layer tempered glass is cadmium telluride double-sided power generation glass.

For the photovoltaic antiglare panel assembly according to the present disclosure, a light-emitting unit is provided on the frame, and the light-emitting unit is electrically connected to the power utilization unit.

For the photovoltaic antiglare panel assembly according to the present disclosure, a reflective film is also provided on the frame.

The present disclosure further provides a photovoltaic power generation system, including at least one of the aforementioned photovoltaic antiglare panel assemblies, a DC (direct current) combiner device, and a DC distribution device, where

- the photovoltaic antiglare panel assembly is provided on a median strip;
- the DC combiner device connects a plurality of photovoltaic antiglare panel assemblies in series;
- the DC distribution device is electrically connected to the DC combiner device, and the DC distribution device is configured to distribute direct current passing through the DC combiner device.

The photovoltaic power generation system provided by the present disclosure further includes: an inverter and an AC (alternating current) distribution device, where the inverter is electrically connected to the DC distribution device, and the inverter is configured to convert the direct current distributed by the DC distribution device into an alternating current;

the AC distribution device is electrically connected to the inverter, and the AC distribution device distributes the alternating current passing through the inverter.

For the photovoltaic power generation system provided by the present disclosure, the photovoltaic antiglare panel is provided in a direction perpendicular or parallel to a highway route course.

The present disclosure further provides a photovoltaic subgrade system, including: at least one of the aforementioned photovoltaic power generation systems, a median strip, a pair of central guardrails, a pair of roadside guardrails, and a subgrade, where the photovoltaic antiglare panel assembly in the photovoltaic power generation system is provided on the median strip, and the pair of central guardrails are provided on two sides of the median strip;

the pair of roadside guardrails are provided on two sides of the subgrade.

For the photovoltaic subgrade system according to the present disclosure, a side slope is provided on each of two sides of the subgrade, and the photovoltaic antiglare panel assembly is provided on the side slope.

The photovoltaic antiglare panel assembly provided in the present disclosure, by using the solar cells in the photovoltaic antiglare panel, can reduce glare from lamplight of the vehicles in the opposite direction, while fully utilizing the solar energy for the photovoltaic power generation, providing green electricity, and facilitating the carbon neutrality of the transportation systems. Moreover, the aforementioned photovoltaic antiglare panel assembly is a combined structure, is convenient to mount, replace, and maintain, and thus is suitable to implement and popularize.

The photovoltaic power generation system and the photovoltaic subgrade system provided in embodiments of the present disclosure, due to use of the aforementioned photovoltaic antiglare panel assembly, have the same advantages as described above, which will not be repeated here.

Additional aspects and advantages of embodiments of the present disclosure will be partly set forth in the following description, and partly become apparent from the following description, or may be learned through practice of embodiments of the present disclosure.

BRIEF DESCRIPTION OF THE DRAWINGS

To more clearly illustrate the technical solutions in the present disclosure or the prior art, the drawings which need to be used in the description of the embodiments or the prior art will be briefly introduced below. Obviously, the drawings described below are for some embodiments of the present disclosure. For those ordinarily skilled in the art, other drawings also could be obtained based on these drawings without inventive effort.

REFERENCE NUMERALS

Figure 1:
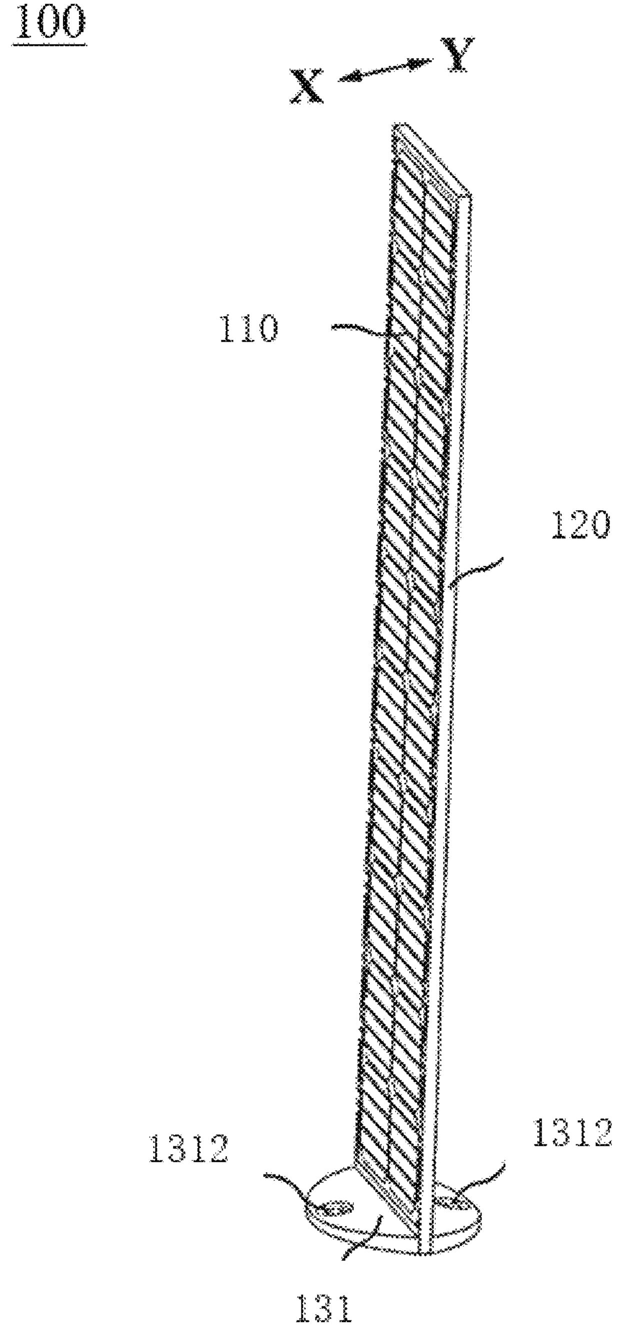
FIG. 1 is a first structural schematic diagram of a photovoltaic antiglare panel assembly provided in the present disclosure.

100: photovoltaic antiglare panel assembly;
110: photovoltaic antiglare panel; 111: solar cell;
120: frame;
130: fixing unit;
131: base; 1311: groove; 1312: screw hole; 1313: bolt;
132: support portion; 1321: cavity;
133: column;
1000: photovoltaic power generation system;
2000: median strip;
3000: central guardrail;
4000: roadside guardrail;
5000: subgrade; 5100: side slope;
X: one side of photovoltaic antiglare panel 110;
Y: another side of photovoltaic antiglare panel 110;
001: a direction in which photovoltaic antiglare panel 110 is provided;
002: highway route course.

DETAILED DESCRIPTION OF THE EMBODIMENTS

To make the objectives, technical solutions, and advantages of the present disclosure clearer, the technical solutions of the present disclosure will be clearly and completely described below with reference to the drawings. Apparently, the described embodiments are only some embodiments of the present disclosure, and not all embodiments. Based on the embodiments in the present disclosure, all other embodiments obtained by those skilled in the art without inventive effort are within the scope of protection of the present disclosure.

In the description of the embodiments of the present disclosure, it should be noted that the terms such as "center", "longitudinal", "lateral", "up", "down", "front", "rear", "left", "right", "vertical", "horizontal", "top", "bottom", "inner", and "outer" indicate the orientation or positional relationship based on the orientation or positional relationship shown in the drawings. They are only for the convenience of describing the embodiments of the present disclosure and simplifying the description, and do not indicate or imply that the device or element referred to must have a specific orientation, or be constructed and operated in a specific orientation. Therefore, they should not be construed as limitations on the embodiments of the present disclosure. Furthermore, the terms "first," "second," and "third" are used for descriptive purposes only and should not be construed as indicating or implying relative importance.

In the description of the embodiments of the present disclosure, it should be noted that, unless otherwise explicitly specified and limited, the terms "connect with" and "connect to" should be interpreted broadly. For example, it can be a fixed connection, a detachable connection, or an integral connection; it can be a mechanical connection or an electrical connection; it can be a direct connection or an indirect connection through an intermediate medium. Those ordinarily skilled in the art could understand the specific meaning of the above terms in the embodiments of the present disclosure based on the specific circumstances.

In the embodiments of the present disclosure, unless otherwise expressly specified and limited, the first feature being "on" or "under" the second feature may mean that the first and second features are in direct contact, or that the first and second features are in indirect contact through an intermediate medium. Moreover, the first feature being "over", "above" or "on top of" the second feature can mean that the first feature is directly above or diagonally above the second feature, or simply that the first feature is at a higher horizontal level than the second feature. The first feature being "below", "under", or "beneath" the second feature can mean that the first feature is directly below or diagonally below the second feature, or simply that the first feature is at a lower horizontal level than the second feature.

In the description of this specification, references to the terms "one embodiment," "some embodiments," "example," "specific example," or "some examples," etc., refer to specific features, structures, materials, or characteristics described in connection with that embodiment or example that are included in at least one embodiment or example of the embodiments of the present disclosure. In this specification, the illustrative expressions of the aforementioned terms do not necessarily refer to the same embodiments or examples. Furthermore, the specific features, structures, materials, or characteristics described may be combined in a suitable manner in any one or more embodiments or examples. Furthermore, in case no contradiction exists, those skilled in the art could combine and integrate different embodiments or examples described herein, as well as the features of the different embodiments or examples.

Northwest region of our country boasts numerous highway routes with considerable mileage, presenting large-scale potential for photovoltaic development. In particular, if antiglare panels and antiglare nets in the middle of highway subgrades can be integrated with photovoltaic power generation, substantial development space can be provided. However, the inventors discovered in research that current antiglare panels, mainly made of materials such as metal and plastic, have limited functionality, and cannot be integrated with photovoltaic power generation.

The embodiments provided in the present disclosure will be described with reference to FIG. 1 to FIG. 13. It should be understood that the following are merely illustrative embodiments of the present disclosure and do not constitute any special limitation on the present disclosure.

Figure 2:
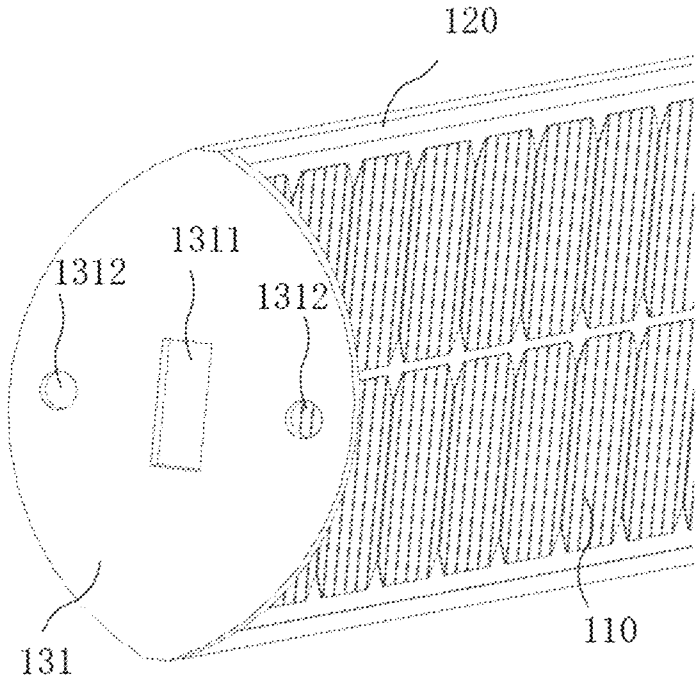
FIG. 2 is a second structural schematic diagram of the photovoltaic antiglare panel assembly provided in the present disclosure.
Figure 3:
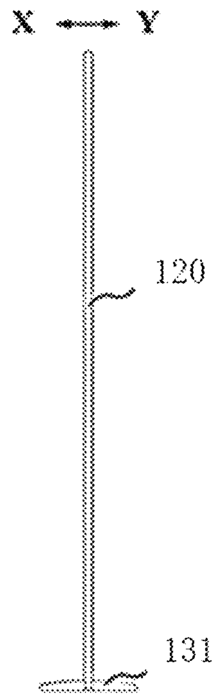
FIG. 3 is a side view structural schematic diagram of the photovoltaic antiglare panel assembly provided in the present disclosure.
Figure 4:
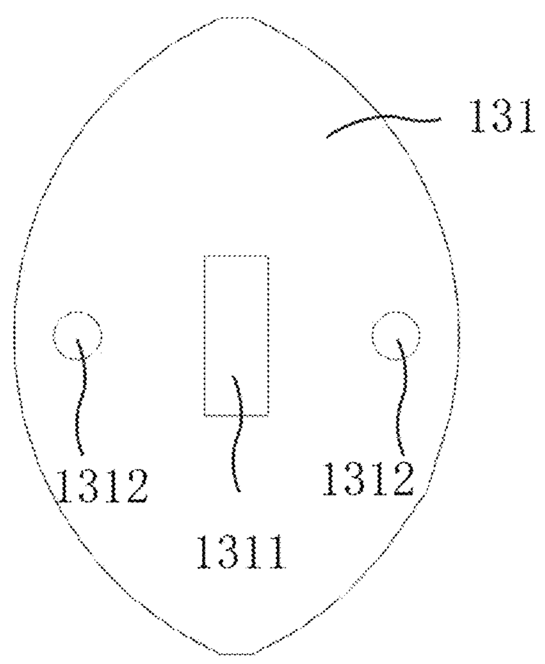
FIG. 4 is a planar structural schematic diagram of a bottom of a photovoltaic base provided in the present disclosure.
Figure 5:
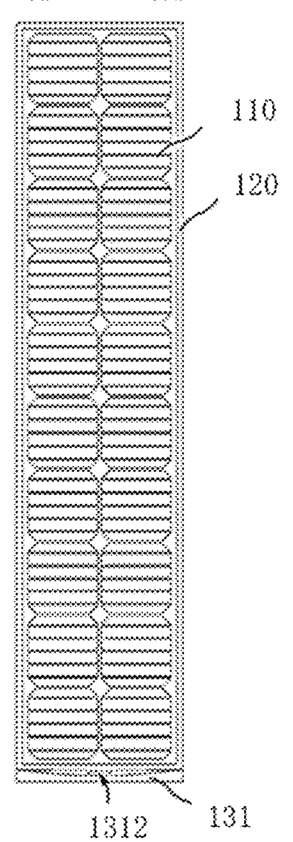
FIG. 5 is a front view structural schematic diagram of the photovoltaic antiglare panel assembly provided in the present disclosure.
Figure 6:
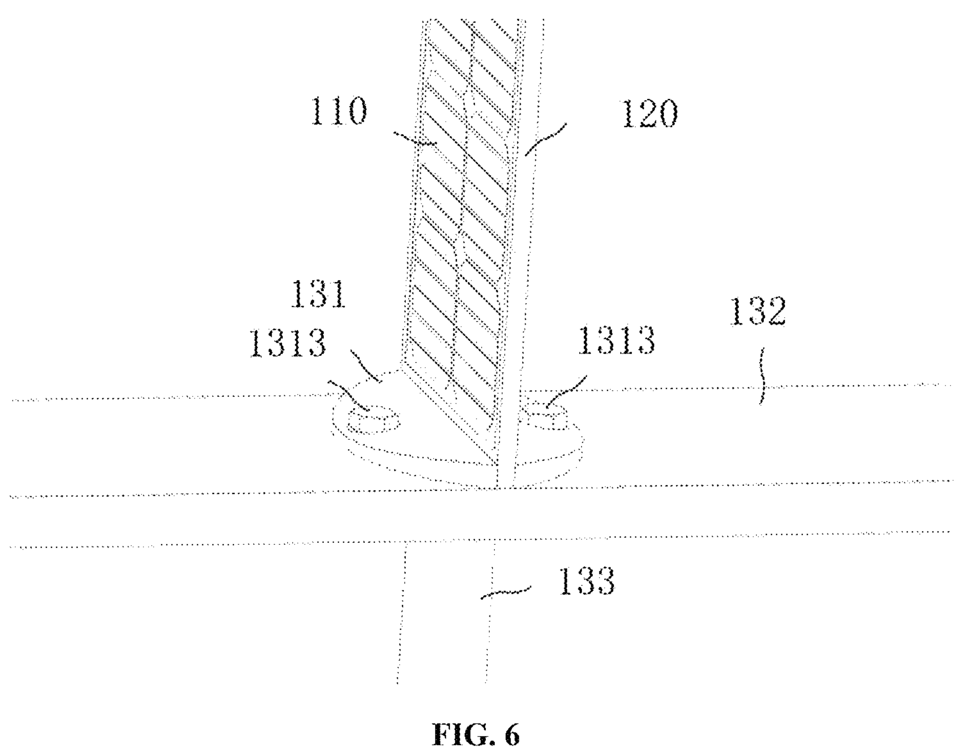
FIG. 6 is a partial structural schematic diagram of the photovoltaic antiglare panel assembly provided in the present disclosure.

FIG. 1 is a first structural schematic diagram of a photovoltaic antiglare panel assembly provided in the present disclosure; FIG. 2 is a second structural schematic diagram of the photovoltaic antiglare panel assembly provided in the present disclosure; FIG. 3 is a side view structural schematic diagram of the photovoltaic antiglare panel assembly provided in the present disclosure; FIG. 4 is a planar structural schematic diagram of a bottom of a photovoltaic base provided in the present disclosure; FIG. 5 is a front view structural schematic diagram of the photovoltaic antiglare panel assembly provided in the present disclosure; and FIG. 6 is a partial structural schematic diagram of the photovoltaic antiglare panel assembly provided in the present disclosure. With reference to FIG. 1 to FIG. 6, a photovoltaic antiglare panel assembly 100 is provided, configured to be provided in a median strip 2000 of a subgrade 5000 of a highway, which can prevent dazzling of lamplights of oncoming vehicles during nighttime driving. The photovoltaic antiglare panel assembly 100 includes a photovoltaic antiglare panel 110, a frame 120, a fixing unit 130, and a power utilization unit.

The aforementioned frame 120 is sleeved on a periphery of the photovoltaic antiglare panel 110, serving to fix the photovoltaic antiglare panel 110. The fixing unit 130 is provided at a bottom of the frame 120 and is configured to connect to the ground so as to fix the photovoltaic antiglare panel 110. Furthermore, the power utilization unit is provided within the fixing unit 130, and the fixing unit 130 also can provide protection for the power utilization unit.

The photovoltaic antiglare panel 110 includes double-layer tempered glass and a plurality of solar cells 111 sandwiched in the double-layer tempered glass. The solar cells 111 are configured to absorb solar energy and then generate electricity using the solar energy. The double-layered tempered glass is configured to fix and protect the solar cells 111. The power utilization unit is electrically connected to the plurality of solar cells 111 respectively, and the power utilization unit is configured to transmit or use the received electrical energy.

The photovoltaic antiglare panel assembly 100 provided in the present disclosure, with use of the solar cells 111 in the photovoltaic antiglare panel 110, can reduce glare from lamplight of vehicles in the opposite direction, while fully utilizing the solar energy for photovoltaic power generation, providing green electricity, and facilitating carbon neutrality of transportation systems. Moreover, the aforementioned photovoltaic antiglare panel assembly 100 is a combined structure, is convenient to mount, replace, and maintain, and thus is suitable to implement and popularize.

Figure 7:
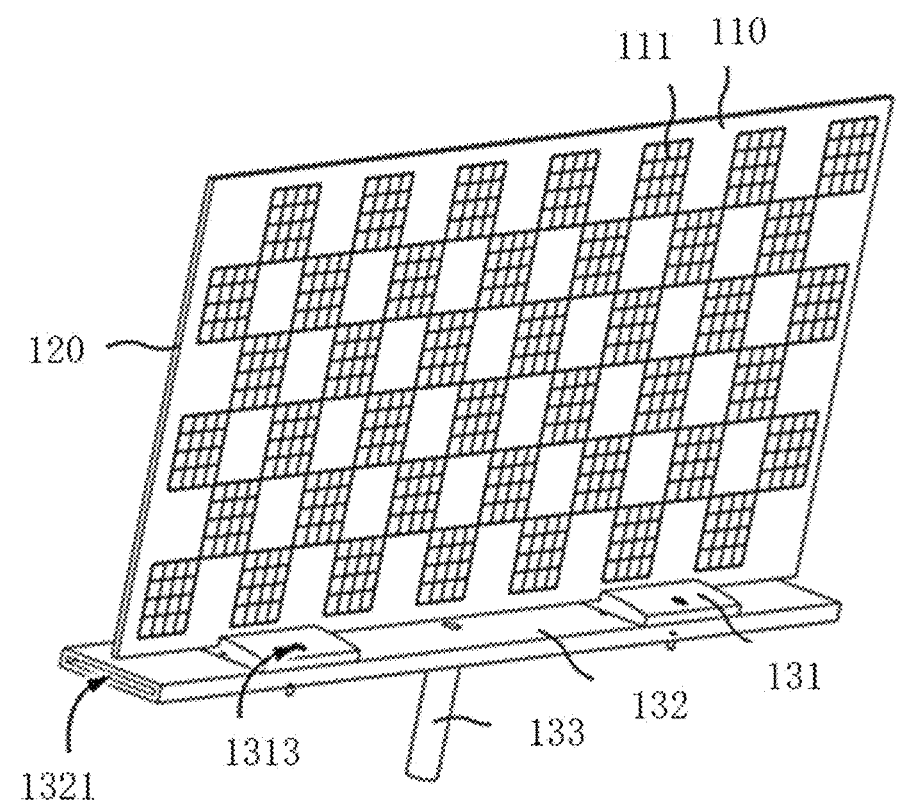
FIG. 7 is a structural schematic diagram of another photovoltaic antiglare assembly provided in the present disclosure.

FIG. 7 is a structural schematic diagram of another photovoltaic antiglare assembly provided in the present disclosure. Please refer to FIG. 7. The photovoltaic antiglare panel 110 can be a cuboid, vertically provided to avoid occupying a relatively large bottom surface area, while still having enough area to generate electricity. For example, the photovoltaic antiglare panel 110 has a rectangular structure with a width of 20-25 cm, a height of 90-100 cm, and a thickness of 0.5-1.5 cm. For another example, the photovoltaic antiglare panel may also be featured by a length of 1.5-2.0 m, a height of 0.8-1.0 m, and a width of 0.5-1.5 cm.

The aforementioned frame 120 can be made of aluminum alloy, having advantages such as light weight, high strength, and corrosion resistance. The frame 120 made of aluminum alloy is provided around the photovoltaic antiglare panel 110, with a width of 1-2 cm, and completely wraps around the photovoltaic antiglare panel 110. The aluminum-alloy frame 120 serves to fix and protect the photovoltaic antiglare panel 110.

In one embodiment provided in the present disclosure, the aforementioned power utilization unit includes a junction box and a power transmission line. A solar panel is connected through the junction box, and the power transmission line is connected to the junction box.

Correspondingly, the fixing unit 130 includes a base 131, a support portion 132 and a column 133 arranged sequentially from top to bottom. Herein, the base 131 is located at the bottom of the frame 120 and is configured to support the frame 120. Furthermore, a rectangular groove 1311 is provided at a center of a bottom end of the base 131, and the junction box is provided in the groove 1311.

Furthermore, an insulating film is provided on an inner side of the groove 1311, which can prevent it from conducting electricity and ensure electrical safety. Furthermore, the base 131 has a built-in wire channel, which allows the junction box to be connected to the photovoltaic antiglare panel 110 via wires. A surface of the wire channel is provided with an insulating film, which can prevent it from conducting electricity. Furthermore, the bottom of the base 131 is 0.7-1.0 m above a road surface of the subgrade 5000. Furthermore, for each photovoltaic antiglare panel 110, only one base 131 with the groove 1311 is provided, while another base 131 is not provided with the groove.

The base 131 is preconfigured with a screw hole 1312 on each of two sides along a central axis of the photovoltaic antiglare panel 110 in an X-Y direction. A bolt 1313 is installed in each screw hole 1312. The function of the bolt 1313 is to secure the base 131 to the underlying support portion 132. The bolt 1313 used is a stainless-steel hexagon head bolt 1313. In some other embodiments, the bolt 1313 is optionally a stainless-steel hex socket head cap bolt 1313.

The aforementioned support portion 132 is provided at the bottom of the base 131. Moreover, the support portion 132 is elongated for installation along the highway. The power transmission line is provided in an inner cavity of the support portion 132. The power transmission line is connected to the junction box. The junction box and the power transmission line can transmit the electrical energy provided by the solar panel for independent use such as energy storage, batteries, and charging piles, or can be connected to the power grid for grid-connected power transmission, etc. Specifically, an inner wall of the inner cavity 1321 of the support portion 132 is provided with an insulating film to form an insulating space, in which wires, cables or the like are connected. A top portion of the support portion 132 is provided with a wire channel, which can connect the wires of the junction box at the bottom end of the base 131. The wires converge and are connected inside the support portion 132 through the wire channel, and finally lead to devices such as the batteries, combiner boxes, and inverters.

Furthermore, the support portion 132 is provided on a center line of the highway, and the photovoltaic antiglare panels 110 can be provided at intervals of 1.2-1.5 m. The aforementioned support portion 132 is made of stainless steel and is elongated. A direction 001 in which the photovoltaic antiglare panel 110 is provided is parallel to a highway route course 002. The support portion 132 has a rectangular cross-section and an inner cavity structure. For example, a width of the support portion 132 is 2-3 cm greater than a width of the photovoltaic antiglare panel 110, being 22-28 cm.

The aforementioned column 133 is located at the bottom of the support portion 132 and is configured to be fixed to the ground. The column 133 can be made of aluminum-zinc coated steel pipe, for example, with a diameter of 15-25 cm, and has a bottom end fixed below the road surface, with a height of 0.5-0.8 m above the ground surface, and a burial depth of 0.6-1.0 m below the ground. A spacing between adjacent columns 133 is 2.5-3.5 m. Furthermore, the column 133 is provided at a center line of the median strip 2000 of the subgrade 5000 of the highway.

In one embodiment provided in the present disclosure, a height of two sides of the base 131 is lower than a height of the middle, and the middle of the base 131 is connected to the frame 120.

Specifically, the base 131, also made of aluminum alloy, has the same width as the photovoltaic antiglare panel 110, and is symmetrically distributed on two sides relative to the photovoltaic antiglare panel 110 in the X-Y direction. The base 131 is configured with a descending arc from the bottom of the photovoltaic antiglare panel 110 to an edge of the base 131, thus allowing rainwater on the photovoltaic antiglare panel 110 to flow down more smoothly and be discharged without stagnation, thus protecting the safety of the photovoltaic antiglare panel. As can be seen from FIG. 3, the base 131 has a nearly semi-elliptical structure. Two bases 131 are provided at the bottom of each aluminum-alloy frame 120, and arranged symmetrically on both sides. For example, the width of the bases 131 can be 15-20 cm, and the bottom of the bases 131 is of a height of 0.7-1.0 m above the road surface of the subgrade 5000.

In the above embodiment, a sealing sheet is provided in the base 131. The sealing sheet is sealedly provided on the outside of the junction box, and can isolate the groove 1311 from the outside to protect the junction box. Furthermore, the sealing sheet is made of insulating material and is flush with the plane of the base 131. The sealing sheet is removable, making it convenient to mount and detach.

In one embodiment provided in the present disclosure, the plurality of solar cells 111 are arranged at intervals in two mutually perpendicular directions, and there is a preset distance between two adjacent solar cells 111.

With reference to FIG. 7, taking the solar cells 111 which are square as an example, the solar cells 111 in the photovoltaic antiglare panel 110 can be arranged in a staggered manner at intervals, where the preset distance can be smaller than a width of the solar cell 111, which has relatively high power generation efficiency. Alternatively, the preset distance can be equal to the width of the solar cell 111, which can effectively ensure the light transmittance of the photovoltaic antiglare panel 110, thus satisfying the bidirectional visibility safety requirements of bidirectionally traveling vehicles, while also reducing the glare from lamplight of vehicles in the opposite direction. For example, the solar cells 111 are arranged in a matrix (row-and-column) layout, with a spacing of 5-10 cm between each individual solar cell 111, which can achieve suitable light transmittance.

Figure 8:
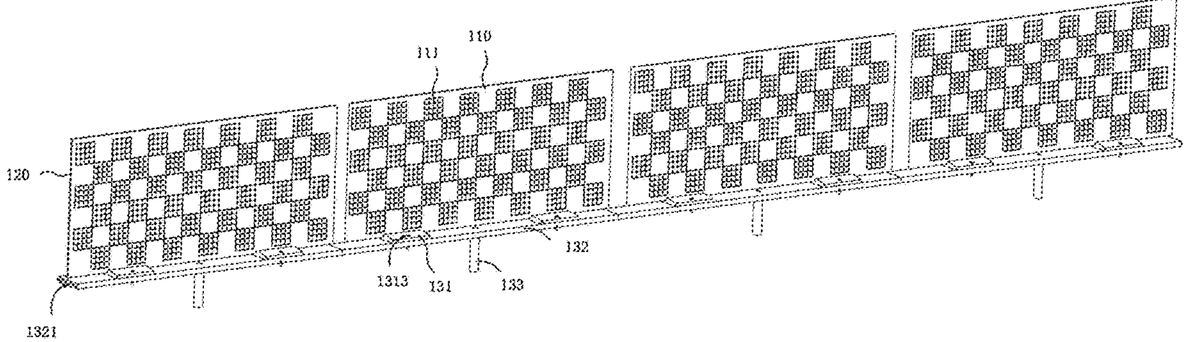
FIG. 8 is an assembly structural schematic diagram of a photovoltaic antiglare assembly provided in the present disclosure.

FIG. 8 is an assembly structural schematic diagram of a photovoltaic antiglare assembly provided in the present disclosure. With reference to FIG. 8, a plurality of photovoltaic antiglare panel assemblies 100 can be connected together for use. Specifically, the support portions 132 of the photovoltaic antiglare panel assemblies 100 are connected with each other, and a distance between corresponding photovoltaic antiglare panels 110 is 20-30 cm. Such structure can both reduce glare from lamplights of vehicles in the opposite direction and prevent eye strain.

Figure 9:
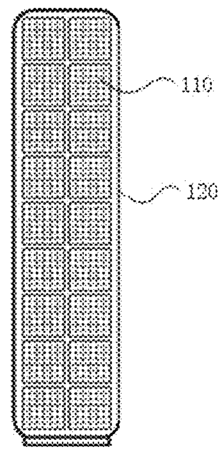
FIG. 9 is a structural schematic diagram of another photovoltaic antiglare panel provided in the present disclosure.
Figure 10:
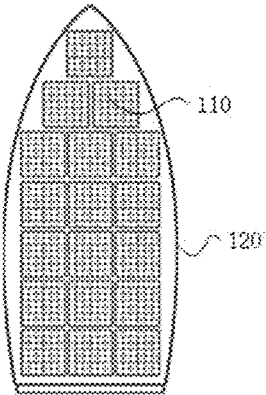
FIG. 10 is a structural schematic diagram of another photovoltaic antiglare panel provided in the present disclosure.

FIG. 9 is a structural schematic diagram of another photovoltaic antiglare panel provided in the present disclosure; and FIG. 10 is a structural schematic diagram of another photovoltaic antiglare panel provided in the present disclosure. Please refer to FIG. 9 and FIG. 10. In one embodiment provided in the present disclosure, the solar cell 111 is square or rhomboid. For example, the photovoltaic antiglare panel 110 in the photovoltaic antiglare panel assembly 100 is rhomboid in shape, with a pointed top, a rhomboid middle, and a base 131 at the bottom. In use, it can be chosen as required, and is not limited to the present embodiment. For example, the solar cell 111 is square with a side length of 15-20 cm.

In one embodiment provided in the present disclosure, an end of the solar cell 111 has a bevel, which can meet different needs in practical applications, so as to save materials, prevent glare, and sufficiently generate electricity.

The advantages of other embodiments of the photovoltaic antiglare panel assembly 100 provided in the present embodiment are mainly reflected in the following two points.

(1) It has strong expansibility, excellent comprehensive functions, rich application scenarios, high applicability, and applicability to different subgrade 5000 conditions.

(2) It is easy to clean and maintain in the later stage, with high practicality.

In one embodiment provided in the present disclosure, the solar cell 111 has power generation areas on both sides, which not only protects the visual consistency of vehicles traveling on both sides of the road, but also enables power generation from both sides, making it suitable for highways with various courses and highly applicable. Specifically, the solar cell 111 is made of polycrystalline silicon or monocrystalline silicon.

In one embodiment provided in the present disclosure, a material of the double-layer tempered glass is cadmium telluride double-sided power-generating glass. The cadmium telluride double-sided power-generating glass is a solar power generation module formed by fusing high-transmittance tempered glass with cadmium telluride thin film material, and has the advantages such as high strength and high power generation efficiency.

In one embodiment provided in the present disclosure, a light-emitting unit is provided on the frame 120, and the light-emitting unit is electrically connected to the power utilization unit.

Specifically, the light-emitting unit can be a colored light, which is powered by a battery that stores electricity generated by the photovoltaic antiglare panel assembly 100 and is configured to switch on and off automatically. It provides a flashing light or indicator light function, and is in an on state at night and in an off state during the day. In this way, the photovoltaic antiglare panel 110 can provide indicator light and safety guidance for vehicles traveling at night.

In one embodiment provided in the present disclosure, the frame 120 is further provided with a material such as a light-emitting film, a light-accumulating film, a reflective film, or a fluorescent film, which can emit or reflect low light at night, providing indicator light and safety guidance for vehicles traveling at night. Furthermore, the photovoltaic antiglare panel assembly 100 provided in the present disclosure is subject to long-term exposure to outdoor dust, rain, snow, bird droppings, etc., which will cause dust and stains to accumulate on its surface. This will seriously reduce the power generation efficiency of the photovoltaic antiglare panel assembly 100, and it is necessary to regularly clean and remove dust from it. Specifically, vehicles equipped with water tanks are used, and low-pressure water guns are installed for close-range cleaning. For stubborn stains, handheld rotating brushes or the like can be used for cleaning. High-pressure tools such as high-pressure water guns should be avoided to prevent damage to the photovoltaic antiglare panel 110. The cleaning frequency needs to be increased, especially in desert areas during the sandstorm season.

Furthermore, if the photovoltaic antiglare panel assembly 100 provided in the present disclosure suffers physical damage, circuit breakage, or other damage, it needs to be repaired and replaced in a timely manner to maintain the stable operation of an entire photovoltaic power generation system 1000.

Figure 11:
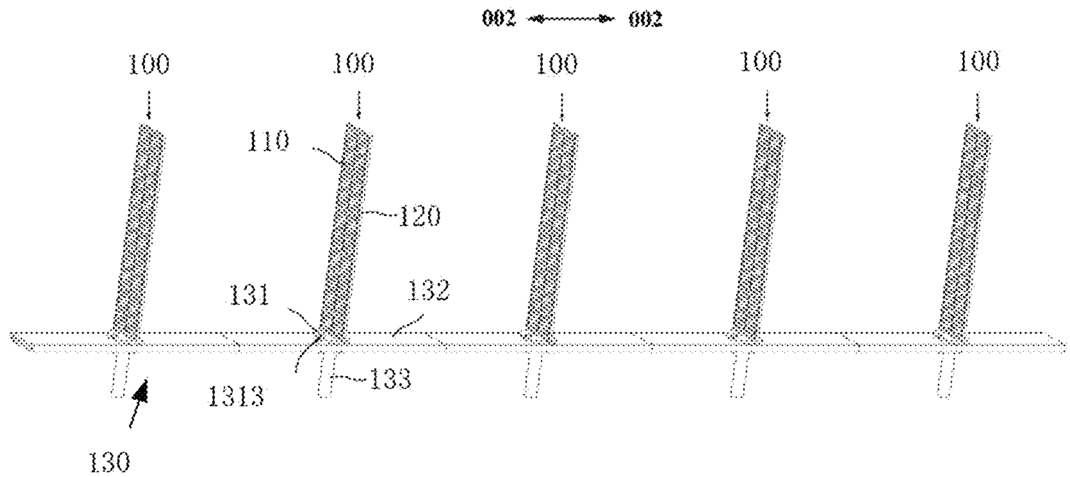
FIG. 11 is a structural schematic diagram of a photovoltaic power generation system provided in the present disclosure.

The present disclosure also provides a photovoltaic power generation system. FIG. 11 is a structural schematic diagram of the photovoltaic power generation system provided in the present disclosure. Please refer to FIG. 11. The photovoltaic power generation system 1000 includes any one of the above-mentioned photovoltaic antiglare panel assemblies 100, a DC combiner device, and a DC distribution device.

The photovoltaic antiglare panel assembly 100 is provided on the median strip 2000.

The DC combiner device connects a plurality of photovoltaic antiglare panel assemblies 100 in series. Specifically, in the photovoltaic power generation system 1000, the plurality of photovoltaic antiglare panel assemblies 100 form a plurality of series groups, and then the plurality of series groups are connected in parallel to the DC combiner device. The DC combiner device can ensure that the photovoltaic antiglare panel assemblies 100 are connected and combined in an orderly manner.

The DC distribution device is electrically connected to the DC combiner device. The DC distribution device is configured to distribute the direct current passing through the DC combiner device and can monitor and protect each path of the direct current distributed.

In one embodiment provided in the present disclosure, the photovoltaic power generation system 1000 further includes an inverter and an AC distribution device. Specifically, the inverter is electrically connected to the DC distribution device. The inverter is configured to convert the direct current distributed by the DC distribution device into alternating current for subsequent use. The AC distribution device is electrically connected to the inverter. The AC distribution device controls, distributes, and monitors the alternating current passing through the inverter according to specific conditions at a user end.

User ends corresponding to the present photovoltaic power generation system 1000 are divided into two types according to the usage type: one is an independent system, such as batteries and energy storage, which charges the batteries and energy storage with current of the AC distribution device to provide power supply and achieve power consumption and use; the other is to connect the current of the AC distribution device to the grid for grid-connected power transmission, thereby achieving power transmission.

Furthermore, the photovoltaic power generation system 1000 relies on a photovoltaic road surface, where a surface of the photovoltaic road surface is made of high-strength, light-transmitting glass with load-bearing capacity, and has built-in single-sided power-generating photovoltaic panels capable of converting solar radiation received by the road surface into electricity.

The advantages of the photovoltaic power generation system 1000 provided in the present embodiment are mainly reflected in the following two points.

(1) Combining the photovoltaic antiglare panel assembly 100 with the photovoltaic power generation system 1000 renders a new type of photovoltaic power generation system 1000 that can make full use of the abundant solar energy resources of the national highway network and provide a new model for the development of the country's green capabilities.

(2) The photovoltaic power generation system 1000 relies on the highway route and also provides green capabilities for the highway system and vehicles, promoting the low-carbon transformation of the highway transportation system.

In one embodiment provided in the present disclosure, the direction 001 in which the photovoltaic antiglare panel 110 is provided is perpendicular or parallel to the highway route course 002.

Depending on different application scenarios, there are multiple ways to set up the photovoltaic power generation system 1000 provided in the present embodiment, which is illustrated below in conjunction with highway course.

(1) For a highway with a mainly north-south course as the highway route course 002, on the median strip 2000 of the highway, the photovoltaic antiglare panel assemblies 100 parallel to the highway course are mainly installed, and the photovoltaic antiglare panel assemblies 100 perpendicular to the highway course are secondarily installed, with a length ratio between the two set in a range of 10:1 to 10:2.

Furthermore, the photovoltaic antiglare panels 110 are installed on the support portion 132 at intervals of 20-30 cm. For example, the photovoltaic antiglare panel assemblies 100 parallel to the highway course can be installed at intervals along a distance of 10-20 km, and the photovoltaic antiglare panel assemblies 100 perpendicular to the highway course can be installed at intervals along a distance of 1-2 km. This staggered installation improves power generation performance and prevents visual fatigue.

For the highway primarily with the north-south course, the highway route course 002 thereof is substantially perpendicular to solar radiation. In other words, one side of each photovoltaic antiglare panel assembly 100 is perpendicular to the solar radiation, which can maximize the exposure to the solar radiation and thus increase an amount of solar radiation conversion per unit highway mileage. Meanwhile, by arranging the two types of photovoltaic antiglare panels in a staggered way, the field of vision can be adjusted to prevent visual fatigue. On the other hand, because the photovoltaic antiglare panel assemblies 100 have different orientations, their photovoltaic reception durations, intensity, power generation performance per unit highway mileage, and the like are different. Combining the two can effectively extend the power generation and power generation time of the photovoltaic power generation system 1000, and make the power generation performance more stable and weather-resistant.

(2) For a highway with a mainly east-west course as the highway route course 002, on the median strip 2000 of the highway, the photovoltaic antiglare panel assemblies 100 perpendicular to the highway course are mainly installed, and the photovoltaic antiglare panel assemblies 100 parallel to the highway course are secondarily installed, with a length ratio between the two set in a range of 10:4 to 10:6.

Furthermore, the photovoltaic antiglare panels 110 are installed on the support portion 132 at intervals of 20-30 cm. For example, the photovoltaic antiglare panel assemblies 100 perpendicular to the highway course can be installed at intervals along a distance of 10-20 km, and the photovoltaic antiglare panel assemblies 100 parallel to the highway course can be installed at intervals along a distance of 5-10 km. This staggered installation can improve power generation performance and prevent visual fatigue.

Because for the highway primarily with the east-west course, the highway course thereof is substantially perpendicular to solar radiation, the photovoltaic antiglare panel 100, having one side facing south, can receive direct solar radiation throughout the day, and two sides of the photovoltaic antiglare panel 100 can receive solar radiation at different times, with one side before 12:00 local time and the other side after 12:00 local time. Comparing the cost per unit distance of the two types of assemblies, combining the two can reduce costs and improve the performance of photovoltaic power generation.

Meanwhile, by arranging the two types of photovoltaic antiglare panels in a staggered way, the field of vision can be adjusted to prevent visual fatigue. On the other hand, because the photovoltaic antiglare panel assemblies 100 have different orientations, their photovoltaic reception durations, intensity, power generation performance per unit highway mileage, and the like are different. Combining the two can effectively extend the power generation and power generation time of the photovoltaic power generation system 1000, and enable more stable and weather-resistant power generation performance.

The advantages of the photovoltaic power generation system 1000 provided in the present embodiment are mainly reflected in the following two points.

(1) The two types of photovoltaic antiglare panel assemblies 100 have different structural characteristics, especially different orientations, photovoltaic reception durations, intensity, power generation performance per unit highway mileage, etc. For different highway route courses 002, the photovoltaic antiglare panel assemblies 100 with different orientations are provided. The two are combined to effectively extend the power generation and power generation time of the photovoltaic power generation system 1000, and enable more stable and weather-resistant power generation performance.

(2) By staggering the photovoltaic antiglare panel assemblies 100 with two orientations, the drivers' field of vision can be adjusted, visual fatigue can be prevented, and safe driving can be achieved.

Figure 12:
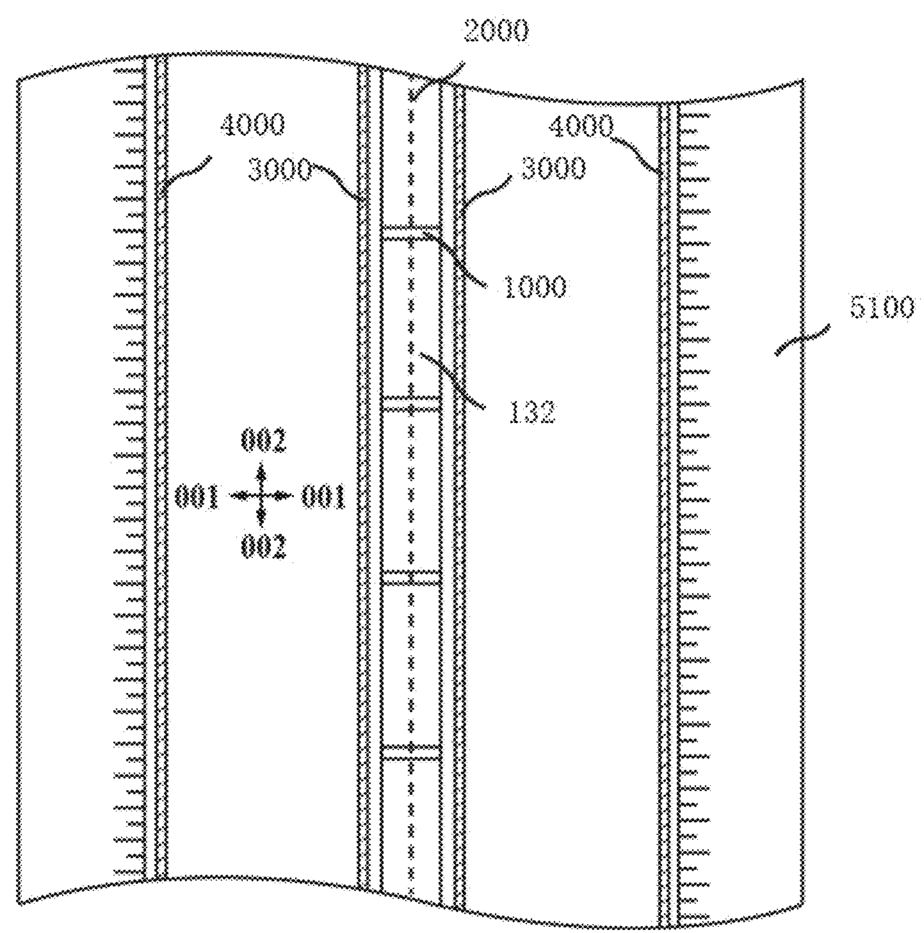
FIG. 12 is a top view structural schematic diagram of a photovoltaic subgrade system provided in the present disclosure.
Figure 13:
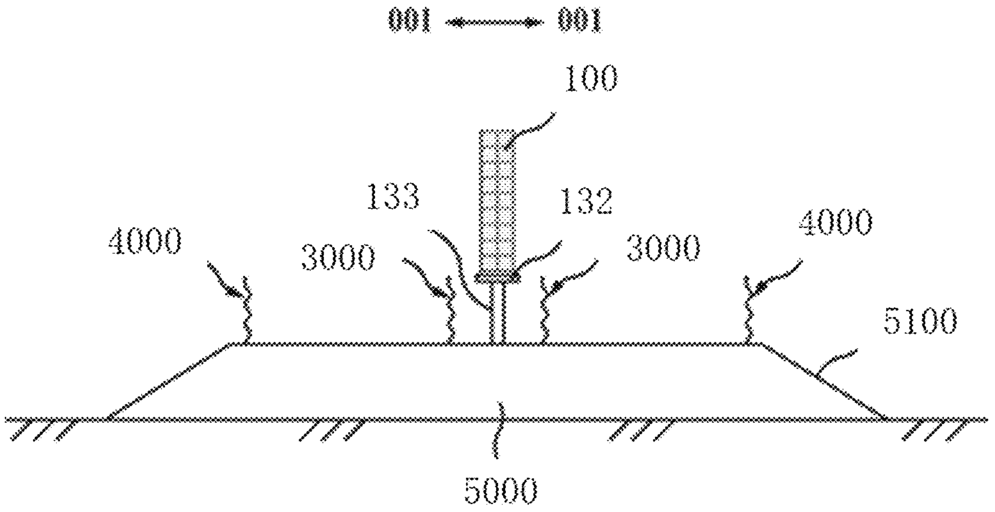
FIG. 13 is a cross-sectional structural schematic diagram of the photovoltaic subgrade system provided in the present disclosure.

The present disclosure also provides a photovoltaic subgrade system. FIG. 12 is a top view structural schematic diagram of the photovoltaic subgrade system provided in the present disclosure; and FIG. 13 is a cross-sectional structural schematic diagram of the photovoltaic subgrade system provided in the present disclosure. Please refer to FIG. 12 and FIG. 13. The photovoltaic subgrade system includes at least one of the above-mentioned photovoltaic power generation systems 1000, a median strip 2000, a pair of central guardrails 3000, a pair of roadside guardrails 4000, and a subgrade 5000. The photovoltaic antiglare panel assemblies 100 in the photovoltaic power generation system 1000 are provided on the median strip 2000. The pair of central guardrails 3000 are provided on both sides of the median strip 2000. The pair of roadside guardrails 4000 are provided on both sides of the subgrade 5000.

The photovoltaic antiglare panels 110 described above can be installed in a direction parallel to the highway course and/or perpendicular to the highway course. The aforementioned central guardrails 3000 are installed at the median strip 2000 of the highway subgrade 5000, located on both sides of the photovoltaic antiglare panel assembly 100. The photovoltaic antiglare panels 110 are 15-25 cm away from a corrugated beam guardrail of the median strip 2000.

Specifically, the central guardrail 3000 consists of corrugated steel guardrail panels and fixing columns 133, with each corrugated steel guardrail panel consisting of 2-3 pieces. The central guardrails 3000 can ensure the safety of the photovoltaic antiglare panel assemblies 100 and prevent vehicle collisions or traffic accidents or the like from affecting the photovoltaic antiglare panel assemblies 100 of the system. Roadside corrugated guardrails are provided at shoulder positions of the subgrade 5000, corresponding to the central guardrails 3000, so as to protect the driving safety of the vehicles. A height of the central guardrails 3000 and the roadside corrugated guardrails is 0.75-1.0 m.

Furthermore, the photovoltaic subgrade 5000 system provided in the present embodiment relies on a photovoltaic road surface, where a surface of the photovoltaic road surface is made of high-strength, light-transmitting glass with load-bearing capacity, and has built-in single-sided power-generating photovoltaic panels capable of converting the solar radiation received by the road surface into electricity.

The advantages of the photovoltaic subgrade 5000 system provided in the present embodiment are mainly reflected in the following two points.

(1) The photovoltaic subgrade 5000 system fully integrates the photovoltaic power generation with the subgrade 5000 structure, which not only meets the functional requirements of the antiglare net of the subgrade 5000 of the highway, but also provides green electricity, which helps the subgrade 5000 of the highway to develop towards electrification, serves the development of electric vehicles, and implements the macro strategy of "photovoltaics+transportation".

(2) As a country with a vast territory and a very large highway network, especially the expressway network, our country has broad application prospects for the novel photovoltaic subgrade 5000 system, which can contribute to the achievement of the carbon peaking and carbon neutrality goals.

In one embodiment provided in the present disclosure, a side slope 5100 is provided on each of both sides of the subgrade 5000, and the photovoltaic antiglare panel assemblies 100 are provided on the side slopes 5100. Based on a slope gradient of the side slopes 5100, the photovoltaic antiglare panel assemblies 100 are fixed to the side slopes 5100 at a certain tilt angle, thereby realizing the photovoltaic power generation.

The present disclosure provides a photovoltaic antiglare panel assembly 100, including a photovoltaic antiglare panel 110, an aluminum alloy frame 120, a base 131, a junction box, wires, a support part, and a column 133, applicable to a median strip 2000 of a highway subgrade 5000 and a central movable guardrail, capable of reducing glare from lamplight of vehicles in an opposite direction, while fully utilizing solar energy for photovoltaic power generation and providing green electricity. The electricity can be used independently for energy storage, batteries, charging piles, etc., or can be connected to the power grid for grid-connected power transmission, etc. The present disclosure also provides a photovoltaic power generation system 1000, including a photovoltaic antiglare panel assembly 100, a DC combiner device, a DC distribution device, an inverter, an AC distribution device, and a user end. The present disclosure also provides a subgrade 5000 system, including a photovoltaic antiglare panel assembly 100, a central guardrail 3000, a roadside corrugated guardrail, and the subgrade 5000.

Finally, it should be noted that the above embodiments are only used to illustrate the technical solutions of the present disclosure, and are not intended to limit them. Although the present disclosure has been described in detail with reference to the foregoing embodiments, those skilled in the art should understand that modifications can still be made to the technical solutions described in the foregoing embodiments, or equivalent substitutions can be made to some of the technical features. Such modifications or substitutions do not cause the essence of the corresponding technical solutions to deviate from the scope of the technical solutions of the embodiments of the present disclosure.

What is claimed is:

1. A photovoltaic antiglare panel assembly, comprising:

a photovoltaic antiglare panel, wherein the photovoltaic antiglare panel comprises double-layer tempered glass and a plurality of solar cells sandwiched in the double-layer tempered glass; and in two mutually perpendicular directions, the plurality of solar cells are arranged at intervals from each other, and two adjacent solar cells have a preset distance therebetween;

when the solar cells are square, the solar cells are arranged in a staggered manner at intervals, and an interval distance is equal to a width of the solar cell;

a frame, wherein the frame is sleeved on a periphery of the photovoltaic antiglare panel;

a fixing unit, wherein the fixing unit is provided at a bottom of the frame; and a power utilization unit, wherein the power utilization unit is provided in the fixing unit, and the power utilization unit is in electrical connection with the plurality of solar cells, respectively, wherein the power utilization unit comprises a junction box and a power transmission line; and the fixing unit comprises:

a base, wherein the base has a same width as the photovoltaic antiglare panel, the base is symmetrically distributed on two sides relative to the photovoltaic antiglare panel, and the base is configured with a descending arc from a bottom of the photovoltaic antiglare panel to an edge of the base;

the base is provided at the bottom of the frame, a rectangular groove is provided at a center of a bottom end of the base, and the junction box is provided in the rectangular groove; and the base is further provided with a wire channel having an insulating film on a surface, wherein a wire connecting the junction box and the photovoltaic antiglare panel is mounted in the wire channel; and a sealing sheet is provided in the base, and the sealing sheet is sealedly provided on an outside of the junction box;

a support portion, wherein the support portion is provided at a bottom of the base, the support portion is in an elongated shape, and configured to be provided along a highway, and the support portion is provided with a cavity, wherein the power transmission line connected to the wire in the junction box is provided in the cavity; and a column, wherein the column is provided at a bottom of the support portion, and is configured to be fixed to ground.

2. The photovoltaic antiglare panel assembly according to claim 1, wherein a height on two sides of the base is lower than a height in a middle of the base, and the middle of the base is connected to the frame.

3. The photovoltaic antiglare panel assembly according to claim 1, wherein two sides of each of the plurality of solar cells have power generation areas.

4. The photovoltaic antiglare panel assembly according to claim 1, wherein a material of the double-layer tempered glass is cadmium telluride double-sided power-generating glass.

5. The photovoltaic antiglare panel assembly according to claim 1, wherein a light-emitting unit is provided on the frame, and the light-emitting unit is electrically connected to the power utilization unit.

6. The photovoltaic antiglare panel assembly according to claim 1, wherein a reflective film is further provided on the frame.

7. A photovoltaic power generation system, comprising the photovoltaic antiglare panel assembly according to claim 1, a DC combiner device, and a DC distribution device, wherein the photovoltaic antiglare panel assembly is provided on a median strip;

the DC combiner device connects a plurality of the photovoltaic antiglare panel assemblies in series; and the DC distribution device is electrically connected to the DC combiner device, and the DC distribution device is configured to distribute direct current passing through the DC combiner device.

8. The photovoltaic power generation system according to claim 7, further comprising: an inverter and an AC distribution device, wherein the inverter is electrically connected to the DC distribution device, and the inverter is configured to convert the direct current distributed by the DC distribution device into alternating current; and the AC distribution device is electrically connected to the inverter, and the AC distribution device distributes the alternating current passing through the inverter.

9. The photovoltaic power generation system according to claim 7, wherein the photovoltaic antiglare panel is provided in a direction perpendicular or parallel to a highway route course.

10. A photovoltaic subgrade system, comprising: the photovoltaic power generation system according to claim 7, a median strip, a pair of central guardrails, a pair of roadside guardrails, and a subgrade, wherein the photovoltaic antiglare panel assembly in the photovoltaic power generation system is provided on the median strip, and the pair of central guardrails are provided on two sides of the median strip; and the pair of roadside guardrails are provided on two sides of the subgrade.

11. The photovoltaic subgrade system according to claim 10, wherein a side slope is provided on each of two sides of the subgrade, and the photovoltaic antiglare panel assembly is provided on the side slope.

* * * * *